United States Patent [19]

Crawford et al.

[11] 3,717,868

[45] Feb. 20, 1973

[54] MOS MEMORY DECODE

[75] Inventors: Robert H. Crawford, Richardson; Marvin W. Smith, Austin, both of Tex.

[73] Assignee: Texas Instruments Incorporated, Dallas, Tex.

[22] Filed: July 27, 1970

[21] Appl. No.: 58,297

[52] U.S. Cl. ............340/347 DD, 307/205, 307/215, 307/218, 307/251

[51] Int. Cl. ............H03k 17/00

[58] Field of Search............340/347 DD; 307/205, 307/215, 218, 207/251, 279

[56] References Cited

UNITED STATES PATENTS

| | | | |
|---|---|---|---|
| 3,541,353 | 11/1970 | Seelbach et al. | 307/205 X |
| 3,356,858 | 12/1967 | Wanlass | 307/205 |
| 3,355,598 | 11/1967 | Tuska | 307/251 X |

*Primary Examiner*—Charles D. Miller
*Attorney*—James O. Dixon, Andrew M. Hassell, Harold Levine, Melvin Sharp, John E. Vandigriff, Henry T. Olsen and Michael A. Sielo, Jr.

[57] ABSTRACT

A digital decoding system for decoding multi-bit parallel channel digital input signals utilizing a cascaded (series) MOSFET switching circuit of one channel type, a cascoded (parallel) MOSFET switching circuit of the same channel type interconnected to produce a first output when the digital input is at a predetermined value and to produce a second output when the digital input is at all other values. This system provides relatively high speed operation and relatively low power consumption by virtue of complementary circuitry between the cascaded MOSFET switching circuits.

8 Claims, 10 Drawing Figures

INVENTORS
Robert H. Crawford
Marvin W. Smith

WITNESS

ATTORNEY

MOS MEMORY DECODE

BRIEF DESCRIPTION OF INVENTION AND BACKGROUND INFORMATION

This invention relates to semiconductor circuits and, more particularly, to a MOS digital decoding system for multi-bit parallel channel digital input signals.

MOS circuit technology, especially in integrated circuits, has many advantages over bipolar circuits. The most significant of these are simplified processing and increase in package density. However, these advantages are somewhat offset by longer switching times which result in lower operating rates for the MOS circuits.

Efforts to improve operating speed of MOS circuits have been concentrated in two areas. The operating speed of MOS transistors has been increased through improved design and new circuits have been developed to better utilize the inherent capabilities of existing MOS transistors. Among the most significant developments in MOS transistor design has been the development of self-aligned gate structures. Most circuit developments for improving operating speed have centered around the so-called "complementary circuits" or some variation thereof.

The self-aligned gate structures are relatively complicated to make in integrated circuit form. Complementary circuits, especially those requiring both P and N-channel transistors, require additional process steps when the circuits are to be built in integrated circuit form. This invention solves these inherent problems by providing a new circuit design which has all the advantages of complementary circuits but which can be implemented using MOS transistors of a single channel type.

In the preceding and all following discussion, the transistors used in this invention will be referred to as MOS transistors. This term is used as a matter of convenience and includes all types of Insulated Gate Field Effect Transistors, commonly referred to as IGFETS.

In accordance with one embodiment of the invention, a decoding system for decoding a multi-bit parallel channel digital input signal into a plurality of single channel output signals is provided. Each combination of the input bits comprising the parallel channel input signal are decoded into a single channel output signal by a circuit comprising essentially two independent switching circuits, each of which has a high and a low resistance state, with the resistance state being determined by a multi-bit parallel channel digital input signal. One of the switching circuits is connected between the systems output terminal and a first reference signal input terminal, and the second switching circuit connected between the same systems output terminal and a reference signal input terminal. The first switching circuit preferably includes a plurality of cascaded (series) MOS switches of one channel type coupled between the first reference signal terminal and the systems output terminal, while the second switching circuit preferably includes a plurality of cascoded (parallel) MOS switches of the same channel type as the cascaded MOS switches respectively coupled between the systems output terminal and a reference signal terminal, which may be common to each of the cascoded MOS switches. The two switching circuits are respectively responsive to predetermined values of the multi-bit parallel channel digital input signal such that one of the circuits is always in its low resistance state, while the other is in its high resistance state. In this manner, the systems output terminal is always coupled by a low resistance circuit to a desired reference signal terminal. This low resistance coupling provides significant improvement in operating speed when the circuit is used to drive capacitive loads, such as other MOS inputs. Additionally, the circuit requires very little standby power when used to drive capacitive loads because essentially all of the current flowing in the output circuit also flows through the load. By this construction, a complementary circuit feature is advantageously provided, yet utilizes switching circuits having common channel type MOS switches.

Another embodiment of this invention provides similar functional capabilities as the embodiment discussed above. In this embodiment, two independent switching circuits are also provided with each having a high and a low resistance state in a manner as aforestated. One of the switching circuits is connected between the systems output terminal and a first reference signal input terminal and the other switching circuit is connected between the systems output terminal and a reference signal terminal. The first switching circuit preferably includes a plurality of cascaded (series) MOS switches of one channel type coupled between the systems output terminal and a first reference signal terminal, while the second switching circuit preferably includes a plurality of substantially cascoded (parallel) MOS switches respectively coupled between the systems output terminal and a reference signal terminal which may be common thereto but such coupling path for each cascoded MOS switch may include at least one of the cascaded MOS switches. Preferably, each of the cascoded MOS switches are respectively coupled to the output terminals of the cascaded MOS switches, thus one of the cascoded MOS switches has a coupling path that does not include one of the cascaded MOS switches. As in the first embodiment, the individual bits comprising the multi-bit parallel channel digital input signal are coupled to the gate terminals of the MOS transistors comprising the system.

This invention advantageously solves many of the problems associated with prior art systems. This is especially true when it is desired to construct the system using integrated circuit technology.

One object of this invention is to provide circuits using MOS transistors of like polarity or channel type and which exhibit complementary circuit characteristics.

Another object of the invention is to provide MOS circuits having complementary circuit characteristics which can be advantageously constructed in integrated circuit form.

Another object of the invention is to provide a MOS transistor digital decode system having improved operating speeds.

These and other objects of this invention will be clear to those skilled in the art in view of the attached drawings and detailed descriptions of the preferred embodiments.

DETAILED DESCRIPTION

Figures 1, 2:
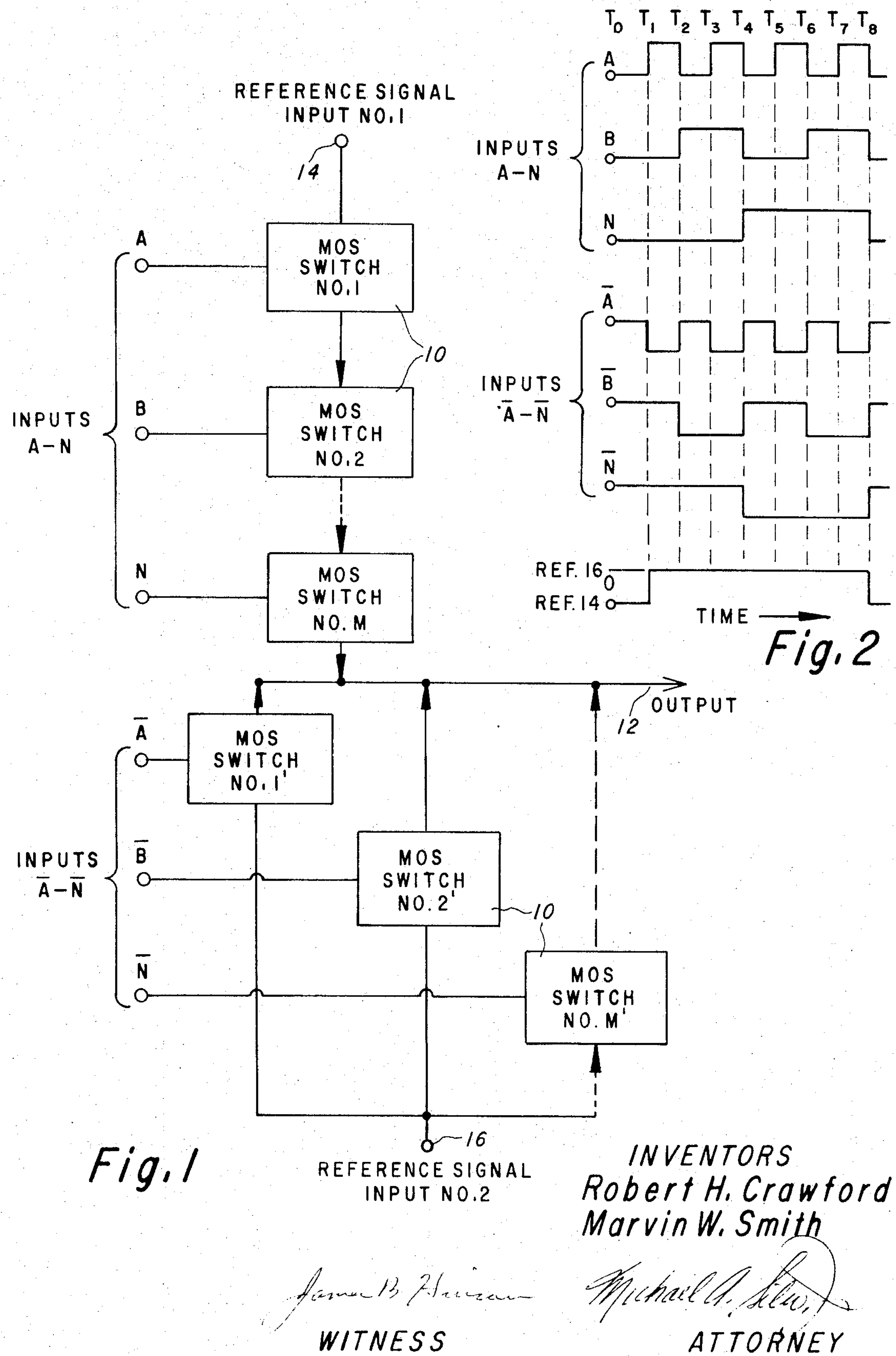
FIGS. 1 and 3 show a functional block diagram of two embodiments of the invention.
FIG. 2 shows typical input and output waveforms for the embodiments illustrated in FIGS. 1 and 3.

A detailed description of the preferred embodiment of this invention follows with reference being made to the drawings wherein like parts have like reference numerals for clarity and understanding of the elements and the novel, useful and unobvious features of this invention.

Referring to FIG. 1, which is a functional block diagram of one embodiment of this invention, the inputs A-N and $\bar{A}$-$\bar{N}$ are respectively coupled to the input channels of the multi-channel parallel digital input signal and the systems output terminal 12 is selectively coupled through cascaded switches 1-M to reference terminal 14 or through one of the MOS cascoded switches 1'-M' to the reference signal input terminal 16 in response to the input signals. Each of the MOS switching circuits 1-M and 1'-M', as illustrated generally at reference numeral 10, are responsive to their respective input signals and each individual switch is characterized by having either a relatively low or a relatively high resistance to the flow of electrical current.

To decode a multi-bit parallel digital input signal, it is necessary to arrange the inputs to switches 1-M and 1'-M' such that the systems output terminal 12 is either coupled to reference signal input terminal 14 or to input reference signal terminal 16. Since each of the inputs A-N and $\bar{A}$-$\bar{N}$ are individual bits of multi-bit parallel channel digital input word, each of these inputs will have either a high or a low value. Additionally, the A-N and $\bar{A}$-$\bar{N}$ inputs must be related such that when the N input is high the $\bar{N}$ input is low and vice versa.

Each of the switching circuits 10 are preferably designed such that they have three terminals. One terminal, a signal input terminal, is coupled to an input signal and two (first and second) switch terminals which are analogous to the contacts of a mechanical switch and are used to connect the switches to each other and other circuits. Each circuit is preferably coupled to a one bit digital signal and is designed such that for one value of the signal the circuit has a low resistance to the flow of electrical current between the switch terminals and is OPEN and for the other value of the signal the circuit has a high resistance to the flow of electrical current between its switch terminals and is CLOSED.

To decode a specific value of a multi-bit parallel digital input signal into a single output, the individual bits of the digital input signal are coupled to the inputs A-N and $\bar{A}$-$\bar{N}$ such that when the digital input signal has the value which is desired to be decoded, all the cascaded (series) MOS switches 1-M are OPEN and all the cascoded MOS switches 1'-M' are CLOSED, and therefore the reference signal applied to terminal 14 is coupled to the systems output terminal 12 via MOS switches 1-M. For any other value of the input signal, at least one of the cascoded (parallel) MOS switches 1'-M' will be OPEN and at least one of the cascaded switches 1-M will be CLOSED, and thereby the reference signal applied to reference signal input terminal 16 is coupled to the systems output terminal 12 via the respective OPEN MOS switch 1'-M'.

By applying substantially different reference signals to the reference terminal 14,16, the systems output terminal 12 will have two distinct values, one value which identifies one predetermined combination of the input signals A-N and $\bar{A}$-$\bar{N}$, and the other value which identifies all other combinations of the inputs. In these circumstances where it is desired to have signal levels on the systems output terminal that are substantially equal to the signal levels of the input signals, the signals applied to the reference signal input terminals 14,16 should be respectively equal to the high and low signal values of the input signals.

It is contemplated that the cascoded MOS switches may be selectively coupled to independent reference signal terminals for the purpose of providing additional decoding capability.

FIG. 2 is a diagram illustrating the input and output signals for a system having a digital input signal consisting of three independent parallel channels or bits. In this diagram each of the independent bits are respectively represented by signals A, B, and N, which are coupled to inputs of the decoding system. As previously discussed, the input signals $\bar{A}$, $\bar{B}$, and $\bar{N}$ are related to signals A, B, and N in that when signal A is high, $\bar{A}$ is low, with the same relationship respectively existing for the other signals. Since the input signal is limited to three independent channels or bits with each signal having only two distinct values (high or low), the input signals as illustrated can only be combined into eight mutually exclusive combinations with each combination respectively representing one value of the input signal. Each of these independent combinations are illustrated in FIG. 2, as function of time, with the beginning of each independent combination being labeled $T_0$ through $T_7$. For completeness, the system output signal is shown for each input condition and labeled "0" with its high and low values labeled 14 and 16 to indicate which reference signal is being coupled to the system output terminal 12.

For purposes of illustration in FIG. 2 and in most applications, the reference signals applied to the high and low reference signal terminals 14,16 are respectively approximately equal to the high and low values of the input signals. This provides a system output signal having high and low levels substantially the same as the input signals applied to the decoder.

At time $T_0$, the inputs A, B, and N are low and switches 1, 2, M will have low resistance to the flow of electrical current and thereby couple the reference signal which is applied to the reference signal terminal 14 to the system output terminal 12. At time $T_1$, input signal A has a high value causing switch 1 to assume its high resistance state, thereby decoupling the reference signal terminal 14 from the system output terminal 12 and the low input signal $\bar{A}$ causes switch 1′ to assume its low resistance state, thereby coupling the reference signal applied to reference signal input terminal 16 to the system output terminal 12.

Figures 3, 4:
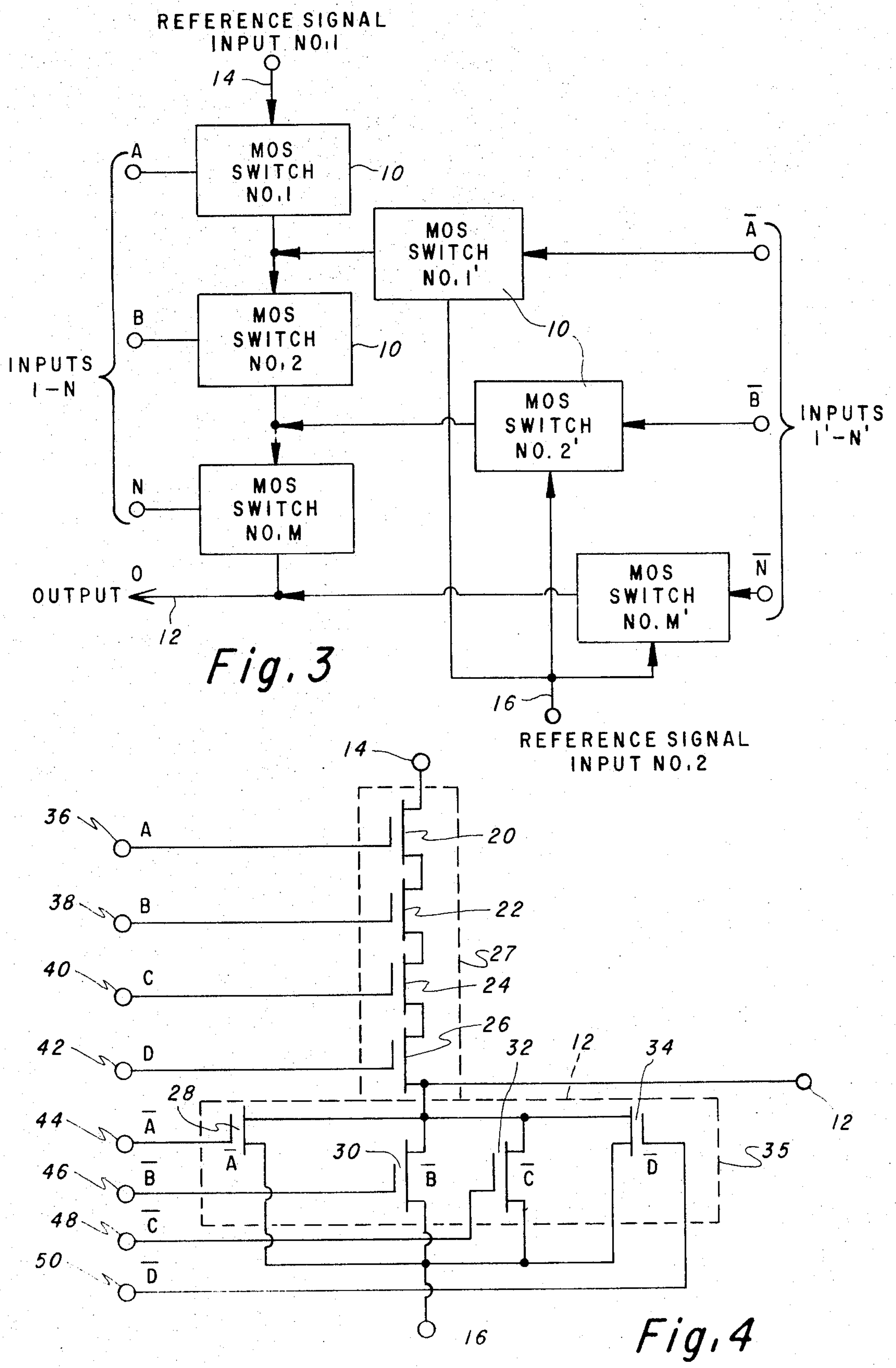
FIGS. 4 and 5 are schematic diagrams of two embodiments of the invention.

For all other combinations of the input signals $T_2$–$T_7$, at least one of the input signals A, B, or N has a high value, thereby decoupling the + signal applied to reference terminal 14 from the system output terminal 12, while at least on of the signals $\bar{A}$, $\bar{B}$, or $\bar{N}$ have a low value, thereby causing the reference signal applied to the reference signal input terminal 16 to be coupled to the system output terminal 12 through at least one of the switches 1′-M′ in the system shown in FIG. 1, and through at least one of the switches 1′-M′ in conjunction with various combinations of the switches 1-M in the system shown in FIG. 3. The exact switching path is easily identified for any combination of the input signals by remembering that each switch has a low resistance when its input signal is low and a high resistance when its input is high.

Although the systems were discussed in detail above using as an example a system having three independent inputs, it is contemplated that the system could be expanded to the number of inputs required by the particular application.

FIG. 3 shows a functional block diagram of another embodiment of the invention. As in the previous embodiment, the decoding system illustrated in FIG. 3 has inputs A-N and $\bar{A}$-$\bar{N}$, two reference signal input terminals 14,16, and one system output terminal 12. As previously discussed, the inputs A-N and $\bar{A}$-$\bar{N}$ are coupled to the individual channels of a multi-bit parallel digital input signal. The individual switches 1-M and 1′-M′ are functionally similar to those discussed in connection with the previous embodiment. The inputs A-N and $\bar{A}$-$\bar{N}$ are arranged such that the system output terminal 12 is either coupled through switches 1-M to reference signal input terminal 14, or by some other combination of switches to reference signal input terminal 16. Although there is only one combination of switches coupling systems output terminal 12 to the reference signal input terminal 14, specifically 1-M, there are three combinations of switches for coupling the systems output terminal 12 to the reference signal input terminal 16. These combinations are switch M′, switch 2′ in conjunction with switch M and switch 1′ in conjunction with switches 2 and M.

Referring to FIG. 4, which is a schematic diagram of one embodiment of the invention, transistors 20, 22, 24, 26 form a first switch which is connected between the system output terminal 12 and a first reference signal input terminal 14. Transistors 28, 30, 32 and 34 form a second switch which is also connected between the system output terminal 12 and a second reference signal input terminal 16. Both of the switches are constructed from a plurality of transistors, an example of which is shown schematically in FIG. 6. Each transistor 60 has three terminals referred to as the source terminal 64, the drain terminal 62, and the gate terminal 68.

Figure 6:
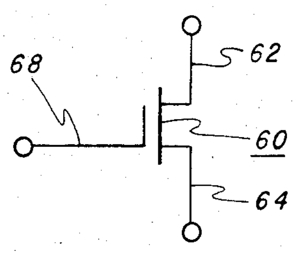
FIG. 6 is a schematic diagram of a MOS transistor.

The P channel MOS transistor used in this circuit is characterized by the fact that, when the gate terminal 68 of FIG. 6 is sufficiently negative with respect to the source terminal 64, the electrical resistance between the source terminal 64 and the drain terminal 62 is relatively low and when the potential of the gate terminal 68 with respect to the source terminal 64 is more positive than this value, the electrical resistance between the drain terminal 62 and the source terminal 64 is quite high. This characteristic permits each of the transistors comprising the circuit of FIG. 1 to be thought of as a voltage controlled switch wherein the on-off states of the switch are controlled by the voltage potential between the gate terminal and the source terminal of the individual transistors.

Although the above discussion was based on P channel transistors, N channel transistors can be used by reversing the gate to drain voltage. Referring to FIG. 4, the transistors 20–26 are connected in cascade (serially), thereby forming first switching means 27, and transistors 28–34 are cascode (parallel) connected to form second switching means 35. The first switching means 27 is formed by connecting the source of the transistor 20 to the drain of transistor 22, the source of transistor 22 to the drain of transistor 24, the source of transistor 24 to the drain of transistor 26, and the source of transistor 26 is connected to the system output terminal 12. The second switching means 35 is formed by connecting the drains of transistors 28-34 together which, in turn, are connected to the system output terminal 12. The source terminals of transistors 28–34 are all connected together and, in turn, connected to a second reference signal input terminal 16. Additionally, in applications where it may be desirable, the source terminal of each of the transistors 28–34 could be connected to independent reference signals.

Referring again in FIG. 4, it can be seen that, if the input signals coupled to terminals 36, 38, 40 and 42 are sufficiently negative, each of the transistors 20–26 will represent a relatively low electrical resistance between their respective drain and source, thereby coupling the reference signal terminal 14 to the system output terminal 12 through a relatively low valve resistance, the total resistance being the algebraic sum of the resistance between the drain and source terminals of the individual transistors. Under this condition, it is also necessary that the input signals applied to input terminals 44, 46, 48 and 50 be sufficiently positive with respect to the reference signal terminal 16 so that the electrical resistance between the drain and source terminal of each of these transistors is relatively high, thereby decoupling the reference signal terminal 16 from the system output terminal 12. This completely describes the operation of this circuit for the first operating condition, wherein the system terminal 12 is coupled to the reference signal terminal 14 through a relatively low resistance.

The second operating state, wherein the system output terminal 12 is coupled to reference terminal 16 through a second relatively low resistance occurs when any one of the inputs 44–50 are sufficiently negative with respect to reference terminal 16 to cause any of the transistors 28–34 to have a relatively low electrical resistance between their respective drain and source terminals. The input signals applied to terminals 36–50 must be arranged such that no attempt is ever made to simultaneously couple the system output terminal 12 to both of the reference signal terminals 14 and 16. This is easily accomplished by arranging the input signals applied to terminals 44–50 such that, when any of these signals are negative with respect to their respective source terminal, at least one of the input signals coupled to terminals 36–42 will be high.

Figure 5:
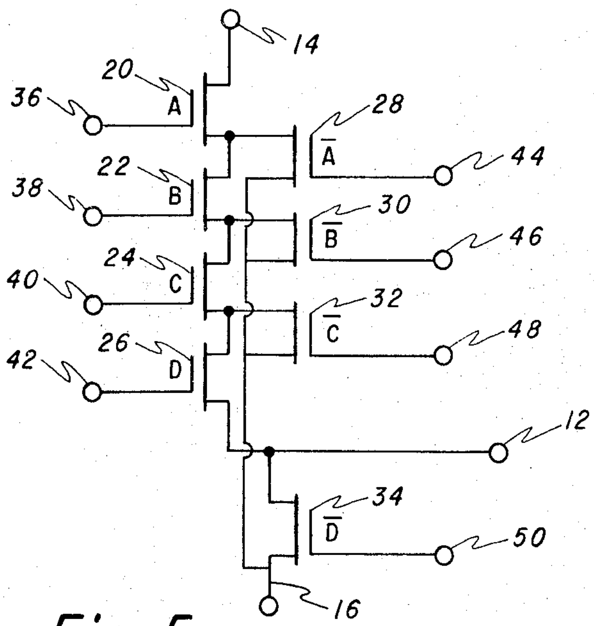

FIG. 5 shows a second embodiment of the invention. This embodiment has two states of operation functionally equivalent to those of FIG. 4, one in which the system output terminal 12 is coupled through a low resistance to reference system terminal 14, and a second state where the system output terminal 12 is coupled through a low resistance to reference signal terminal 16. This embodiment has a first operating state in which the system output terminal 12 is coupled through a low value resistor to reference signal terminal 14 when the input signals 36–42 have values such that their respective transistors 20–26 have a relatively low resistance between their respective drain and source terminals and input signals 44–50 are such that their respective transistors 28–34 have relatively high resistance between their respective drain and source terminals.

In the second operating state, the reference signal applied to reference signal terminal 16 is coupled to the system output terminal 12 through four substantially parallel paths with each of these paths with one exception consisting of serially connected MOS transistors. One coupling path is provided by a single transistor 34. The three other paths, with each path consisting of two or more serially connected transistors, are (a) through transistor 26 and 32, (b) through transistors 24, 26 and 30, and (c) through transistors 22, 24, 26 and 28.

In each of these embodiments, the input signals must be arranged such that either the reference signal applied to reference signal terminal 14 or the reference signal applied to reference signal terminal 16 is coupled to the system output terminal 12 on a mutually exclusive basis. This condition is assured by observing the rules relating to input signals previously discussed in reference to the systems illustrated in FIGS. 1 and 3.

One of the least expensive methods of constructing either the circuit of FIGS. 4 or 5 is as an integrated circuit. As an integrated circuit, the interconnections required between the various transistors can be diffused regions within the substrate and may be formed during the same diffusion cycle which is used to form the drain and collector junctions for the transistors. These diffusions can be made using normal, well-known semiconductor processing techniques.

Figure 8:
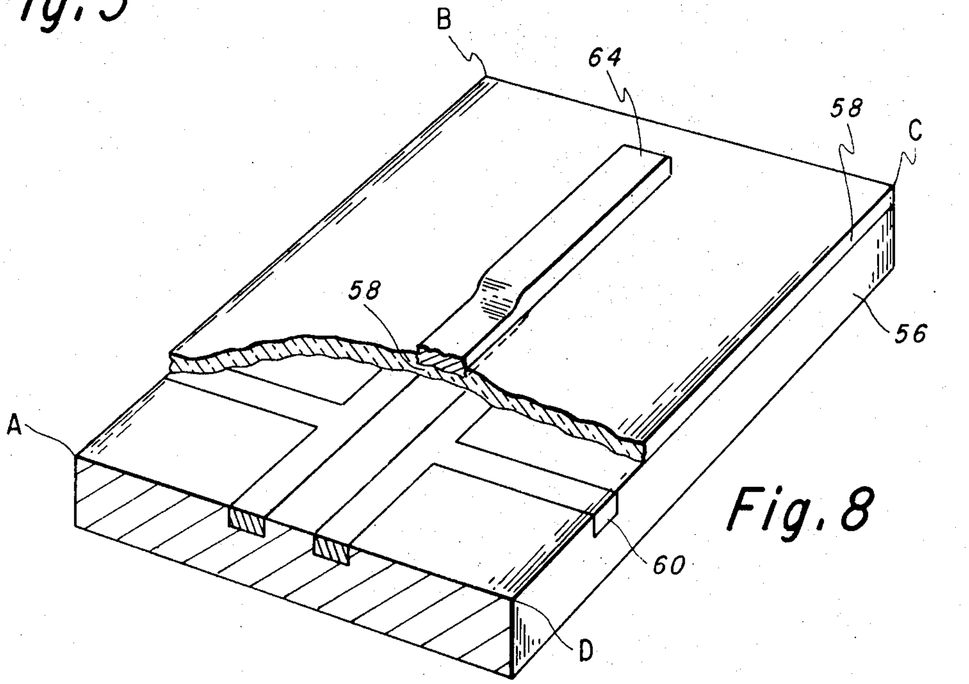
FIG. 8 is an isometric view of a section of the integrated circuit of FIG. 7 with a partial cutaway of the insulating and metallization layers for graphic purposes.

FIG. 8 shows a section form an integrated circuit implementation of the circuit shown in FIG. 4. This section was taken from the integrated circuit illustrated in FIG. 7 with corners *a*, *b*, *c*, and *d* as illustrated.

Assuming that the transistors are to be P-channel devices, the construction process begins with an N-type substrate 56 having appropriate resistivity. By masking and diffusion techniques, P-type dopants are diffused into the surface of substrate 56 to form channels of P-type semiconductor material as illustrated generally at reference numeral 60 of FIG. 8. In the areas where an MOS transistor is to be formed, two parallel P-type regions are diffused into the substrate. Similar channels may be used to form both the MOS transistor drain and source junctions and the interconnections between the various transistors. After completion of the diffusion cycle, a layer of insulating material 58 is formed on the surface of the semi-conductor substrate 56. To form the transistor, it is only necessary that the thickness of the insulating layer 58 be reduced in the area overlying the substrate and between the two parallel diffused P-type regions which are to be used as drain and source junctions and a conductive layer be formed overlying the insulating layer to form the gate terminal. These operations can be preformed using well-known semiconductor processing techniques.

Figure 7:
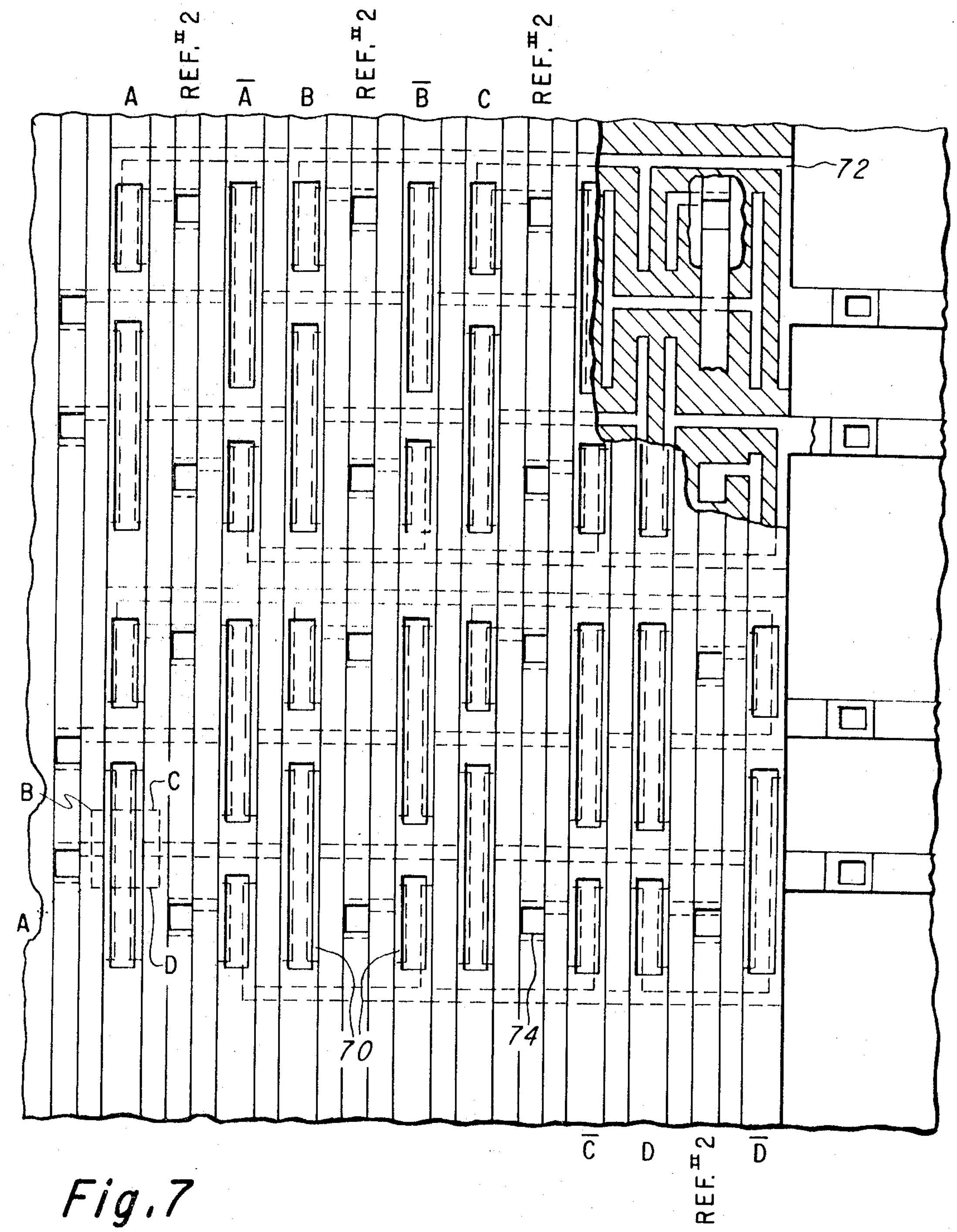
FIG. 7 is a top view of an integrated circuit implementation of the circuit of FIG. 4 with portions of the top layers partially cut away to expose the semiconductor substrate for graphic purposes.

FIG. 7 is a top view of an integrated circuit for four independent decoders using the circuit illustrated in FIG. 4. In this integrated circuit, the input and reference signals are applied to conductor strips which run the entire length of the substrate and are relatively parallel to each other. The inputs labeled A, B, C, and D, respectively, correspond to terminals 36, 38, 40 and 42 of FIG. 4, and the inputs $\bar{A}$, $\bar{B}$, $\bar{C}$, and $\bar{D}$ represent inputs 44, 46, 48 and 50. The difference between A and $\bar{A}$ is that when the A signal is high, the $\bar{A}$ signal is low and vice versa. The same relationship respectively exists for each of the other inputs.

Examples of transistors used in constructing the various circuits are shown generally at reference numeral 70 in FIG. 7. The diffused regions used to interconnect the various transistors are shown generally at reference numeral 72. The insulating layer and the metallization strips have been cut away in the upper right hand corner of FIG. 7 to expose the underlying substrate and to show the diffused connecting regions, illustrated generally at reference numeral 72. Additionally, the reference signal terminals must be interconnected with the diffused conductors which are used to provide connecting means between the reference signals and the transistors. These connections are achieved by forming openings in the insulating layer in regions where the connection is to be made before the conductive strips are formed. These areas are illustrated generally at reference numeral 74 in FIG. 7.

The above described MOS transistors, diffused interconnection regions, metallization strips, and interconnections can be formed using well-known semiconductor process.

It should be noted that transistors 20–26 operate as "source followers" and thus have a voltage gain less than one. This characteristic must be carefully considered in applying this system because it results in a decrease in the output signal at the system output terminal 12 when compared to the input signals coupled to input terminals 36–50.

Figure 10:
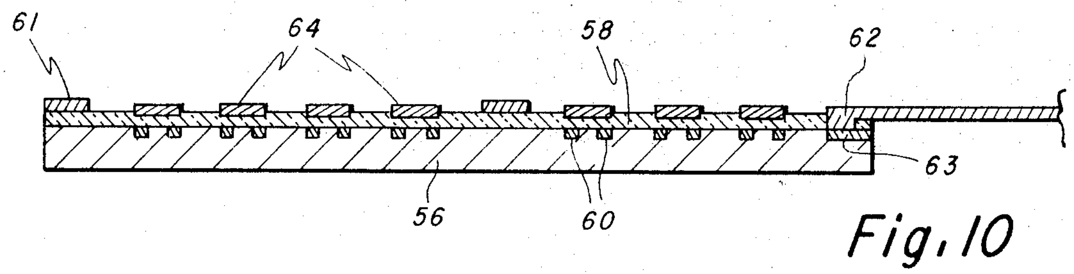
FIG. 10 is a cross-sectional view of the integrated circuit shown in FIG. 9 taken along the view plane 10—10.
Figure 9:
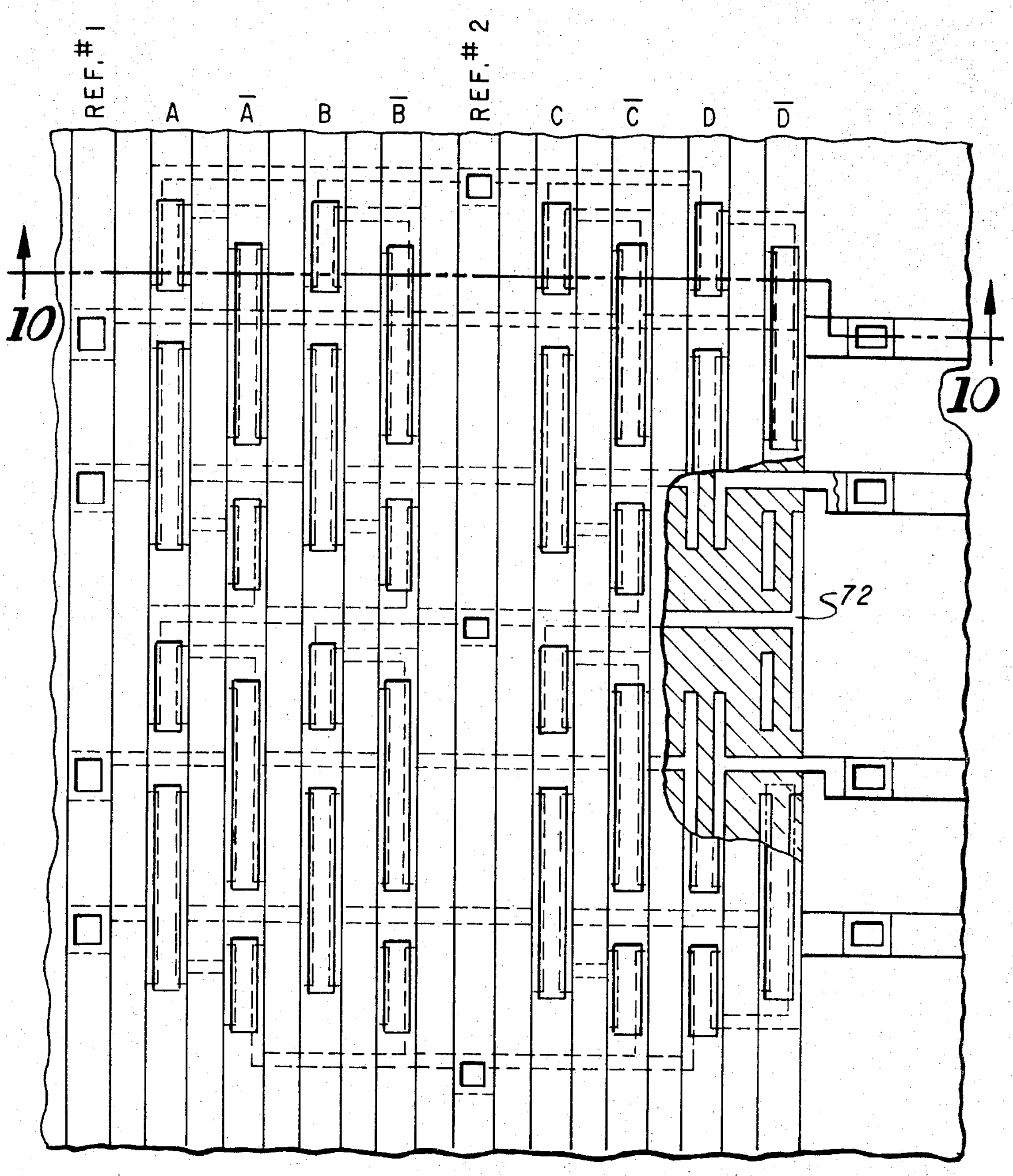
FIG. 9 is a top view of an integrated circuit implementation of the circuit shown in FIG. 3 with portions of the top layer partially cut away to expose the substrate for graphic purposes.

FIG. 9 is a top view of an integrated circuit implementation of the circuit illustrated in FIG. 5. The basic procedures used to form this circuit are identical with those previously discussed with reference to FIG. 4. FIG. 10 is a cross-section taken along plane 10–10 of FIG. 9. This figure illustrates the thin regions of the insulating layer 58 which underlie the conductor 64 in the gate area between the drain and source junctions 60 of the MOS transistors. Additionally, the figure shows a metallic conductor 62 contacting a diffused region which is used as a conductor, as illustrated generally at reference numeral 63 in FIG. 10. Metallic conductors overlying regions where there are no underlying diffusions for either conductors, contacts, or transistors are also illustrated generally at reference numeral 61.

It will be apparent from the foregoing descriptions of the embodiments in light of the drawings that this invention provides a unique MOS decoding circuit which can be easily implemented in integrated circuit form. This circuit advantageously solves many of the inherent problems associated with constructing MOS complementary integrated circuits in integrated circuit form.

The present invention have been described and defined in detail, and illustrated in preferred embodiments. It will be apparent, therefore, to one skilled in the arts herein encompassed, that many changes and modifications are possible within the ordinary skill of such artisans without departing from the spirit and contemplated scope of the invention described, defined and illustrated herein.

What is claimed is:

1. A digital decoding system for selectively decoding a multi-bit digital input signal, said system including first and second reference signal input means and at least one system output means, comprising in combination:

a. a first plurality of solid state switching circuits, each having at least one insulated gate transistor of a first channel type;

b. a second plurality of solid state switching circuits, each having at least one insulated gate transistor of said first channel type; wherein c. each of said first and second switching circuits have at least one signal input terminal and first and second switch terminals, and wherein d. said first switching circuits are cascade coupled between said first reference signal means and said system output means such that at least one of said first switch terminals is coupled to said first reference signal, at least one of said second switch terminals is coupled to said system output means, and the remaining of said second switch terminals are connected to at least one of said first switch terminals; and wherein e. said second plurality of switching circuits are connected such that at least one of said second switch terminals is connected to said second reference signal input means and in common with the remaining of said second switch terminals, and at least one of said first switch terminals is connected to said system output means with others of said first switch terminals being connected to at least one of said first switch terminals of said first switching circuit by means other than one of said first insulated gate transistors; and wherein f. when a preselected value of said input signal is coupled to said system, said first switching circuits are OPEN and said second switching circuits are CLOSED, thereby coupling said first reference signal to said system output means; and wherein g. for substantially all other values of said input signal coupled to said system, at least one of said first switching circuits is CLOSED and at least one of said second switching circuits is OPEN, thereby coupling said second reference signal to said system's output means.

2. A digital decoding system in accordance with claim 1 wherein said first channel type is P-channel.

3. A digital decoding system in accordance with claim 1 wherein said first channel type is N-channel.

4. A digital decoding system in accordance with claim 1 wherein said first and second switching circuits are formed within a common semiconductor substrate, and selectively interconnected by selectively doped regions within said common semiconductor substrate.

5. A digital decoding system for selectively decoding a multi-bit digital input signal, said system including first and second reference signal input means and at least one system output means, comprising in combination:

a. a first plurality of insulated gate field effect transistors of a first channel type, each having source, drain and gate terminals; and b. a second plurality of insulated gate field effect transistors of said first channel type, each having source, drain and gate terminals; wherein c. said first plurality of insulated gate field effect transistors are source-to-drain cascade connected with the drain terminal of the first insulated gate field effect transistor in the cascade being connected to said first reference signal means and the source terminal of the last insulated gate field effect transistor in the cascade being connected to said system output means; and wherein d. said second plurality of insulated gate field effect transistors are connected such that the source terminal of each of said second plurality of transistors is connected in common to said second reference signal means with at least one of the drain terminals of said second plurality of transistors being connected to said systems output means with other drain terminals connected by means other than one of said first insulated gate field effect transistors to a respective source terminal of a transistor of said first plurality of transistors; and wherein e. when a predetermined value of said digital input signal is coupled to the gate of said first and second pluralities of transistors, said reference signal is coupled to said system output means; responsive to a second predetermined value of said input signal said second reference signal is coupled to said output means through one of said second plurality of transistors and the source-drain path of at least one of said first plurality of transistors, and responsive to a third predetermined value of said input said second reference signal is coupled to said output means only through one of said second plurality of transistors.

6. A digital decoding system in accordance with claim 5 wherein said first channel type is P-channel.

7. A digital decoding system in accordance with claim 5 wherein said first channel type is N-channel.

8. A digital decoding system in accordance with claim 5 wherein said first and second switching circuits are formed within a common semiconductor substrate, and selectively interconnected by selectively doped regions within said common semiconductor substrate.

* * * * *

Notice of Adverse Decision in Interference

In Interference No. 98,761, involving Patent No. 3,717,868, R. H. Crawford and M. W. Smith, MOS MEMORY DECODE, final judgment adverse to the patentees was rendered Aug. 17, 1976, as to claims 1, 2, 3, 4, 5, 6, 7 and 8.

[*Official Gazette November 30, 1976.*]